(12) United States Patent
Shin et al.

(10) Patent No.: US 12,557,486 B2
(45) Date of Patent: Feb. 17, 2026

(54) RESONANCE STRUCTURE OF DISPLAY DEVICE AND METHOD OF PROVIDING THE SAME

(71) Applicant: Samsung Display Co., Ltd., Yongin-si (KR)

(72) Inventors: Hyuneok Shin, Yongin-si (KR); Joonyong Park, Yongin-si (KR); Juhyun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 509 days.

(21) Appl. No.: 18/192,895

(22) Filed: Mar. 30, 2023

(65) Prior Publication Data

US 2024/0107825 A1 Mar. 28, 2024

(30) Foreign Application Priority Data

Sep. 27, 2022 (KR) .................. 10-2022-0122868

(51) Int. Cl.
*H10K 59/124* (2023.01)
*H10K 59/12* (2023.01)
*H10K 59/80* (2023.01)

(52) U.S. Cl.
CPC ....... *H10K 59/124* (2023.02); *H10K 59/1201* (2023.02); *H10K 59/876* (2023.02)

(58) Field of Classification Search
CPC . H10K 59/124; H10K 59/1201; H10K 59/876
USPC .......................................................... 257/91
See application file for complete search history.

(56) References Cited

U.S. PATENT DOCUMENTS

| 7,973,319 | B2 | 7/2011 | Kashiwabara et al. |
| 9,530,980 | B2 | 12/2016 | Oh et al. |
| 10,840,308 | B2 | 11/2020 | Choi |
| 2006/0033099 | A1 | 2/2006 | Chung et al. |
| 2010/0200875 | A1 | 8/2010 | Takei |
| 2014/0183460 | A1 | 7/2014 | Kim et al. |
| 2018/0062116 | A1* | 3/2018 | Park ................ H10K 59/876 |
| 2021/0211641 | A1* | 7/2021 | Do ................... G02B 27/017 |

(Continued)

FOREIGN PATENT DOCUMENTS

| JP | 200593399 A | 4/2005 |
| JP | 2006186324 A | 7/2006 |

(Continued)

*Primary Examiner* — Xia L Cross
(74) *Attorney, Agent, or Firm* — CANTOR COLBURN LLP

(57) ABSTRACT

A display device includes a substrate including an upper surface, a pixel circuit layer on the substrate and comprising a transistor, an insulating layer on the pixel circuit layer, the insulating layer defining a trench having a depth, and a first pixel electrode connected to the pixel circuit layer, the first pixel electrode having a thickness which is greater than the depth of the trench. The first pixel electrode includes a center area overlapping the trench, and a peripheral area which is adjacent to the center area, a lower surface corresponding to the center area and to the peripheral area, and a distance from the lower surface of the first pixel electrode to the upper surface of the substrate, in the center area, being smaller than a distance between the lower surface of the first pixel electrode and the upper surface of the substrate, in the peripheral area.

26 Claims, 19 Drawing Sheets

(56) References Cited

U.S. PATENT DOCUMENTS

2022/0123265 A1     4/2022   Na
2024/0206242 A1*   6/2024   Li ..................... H10K 59/1201

FOREIGN PATENT DOCUMENTS

KR     1020190050170 A     5/2019
KR     1020220050298 A     4/2022

\* cited by examiner

RESONANCE STRUCTURE OF DISPLAY DEVICE AND METHOD OF PROVIDING THE SAME

This application claims priority to Korean Patent Application No. 10-2022-0122868, filed on Sep. 27, 2022, and all the benefits accruing therefrom under 35 U.S.C. § 119, the disclosure of which is incorporated by reference herein in its entirety.

BACKGROUND

1. Field

The disclosure relates to a display device and a method of manufacturing (or providing) the display device.

2. Description of the Related Art

Display devices are devices configured to provide, to users, visual information such as images or videos. In accordance with the development of various electronic devices such as computers and large-size televisions, various types of display devices applicable thereto are being developed. Electronic devices based on mobility thereof are being widely used, and tablet personal computers (PCs) are being widely used as portable electronic devices, as well as small-size electronic devices such as mobile phones.

A display device includes a display area and a non-display area, and a plurality of emission elements are arranged in the display area. A display device may provide images using light emitted by the plurality of emission elements. The emission elements may include a pixel electrode and a counter electrode.

SUMMARY

One or more embodiments provide a display device with improved reliability. One or more embodiments provide a method of manufacturing (or providing) a display device with improved reliability and reduced manufacturing costs.

Additional aspects will be set forth in part in the description which follows and, in part, will be apparent from the description, or may be learned by practice of the presented embodiments of the disclosure.

According to an embodiment, a display device may include a substrate, a pixel circuit layer disposed on the substrate and including at least one thin-film transistor, a via insulating layer disposed on the pixel circuit layer and including a trench having a first depth, a first pixel electrode disposed on the via insulating layer and having a thickness greater than the first depth of the trench, where the first pixel electrode may include a center area overlapping the trench and a peripheral area located outside the trench, and a distance between a lower surface of the first pixel electrode and an upper surface of the substrate in the center area may be smaller than a distance between the lower surface of the first pixel electrode and the upper surface of the substrate.

According to an embodiment, the first pixel electrode may include a lower layer, an intermediate layer disposed on the lower layer and having a thickness identical to or greater than the first pixel electrode of the trench, and an upper layer disposed on the intermediate layer, and the intermediate layer may include a transparent conductive material.

According to an embodiment, the intermediate layer may include at least one of zinc oxide ($ZnO_x$), zinc tin oxide ($ZnSnO_x$), indium zinc oxide ($InZnO_x$), and molybdenum oxide ($MoO_x$).

According to an embodiment, the upper layer may include a transparent conductive material different from the transparent conductive material included in the intermediate layer.

According to an embodiment, a thickness of the intermediate layer in the center area may be greater than a thickness of the intermediate layer in the peripheral area.

According to an embodiment, the intermediate layer may be arranged only in the center area.

According to an embodiment, the lower layer may have uniform thicknesses in the center area and the peripheral area.

According to an embodiment, the upper layer may have uniform thicknesses in the peripheral area and the center area.

According to an embodiment, the display device may further include a second pixel electrode disposed on the via insulating layer and not overlapping the trench.

According to an embodiment, a distance between a lower surface of the second pixel electrode and the upper surface of the substrate may be greater than a distance between the lower surface of the first pixel electrode and the upper surface of the substrate.

According to an embodiment, a distance between an upper surface of the second pixel electrode and the upper surface of the substrate may be greater than a distance between a lower surface of the first pixel electrode and the upper surface of the substrate.

According to an embodiment, the first pixel electrode may include a first lower layer, a first intermediate layer disposed on the first lower layer and filling the trench, and a first upper layer disposed on the first intermediate layer, and the second pixel electrode may include a second lower layer and a second upper layer disposed above the second lower layer and including a same material as the first upper layer.

According to an embodiment, a distance between an upper surface of the first upper layer and the upper surface of the substrate may be equal to a distance between an upper surface of the second upper layer and the upper surface of the substrate.

According to an embodiment, the second pixel electrode may further include a second intermediate layer disposed between the second lower layer and the second upper layer and including a same material as the first intermediate layer, and a thickness of the second intermediate layer may be smaller than a thickness of the first intermediate layer.

According to an embodiment, a display device may include a substrate, a pixel circuit layer disposed on the substrate and including at least one thin-film transistor, a via insulating disposed on the pixel circuit layer and having a trench, and a first pixel electrode including a first lower layer, a first upper layer above the first lower layer, and a second pixel electrode including a second lower layer and a second upper layer on the second lower layer, where a distance between at least a portion of a lower surface of the first lower layer and an upper surface of the substrate may be smaller than a distance between a lower surface of the second lower layer and the upper surface of the substrate, and a distance between an upper surface of the first upper layer and the upper surface of the substrate may be equal to a distance between an upper surface of the second upper layer and the upper surface of the substrate.

According to an embodiment, the first intermediate layer may include at least one of zinc oxide ($ZnO_x$), zinc tin oxide ($ZnSnO_x$), indium zinc oxide ($InZnO_x$), and molybdenum oxide ($MoO_x$).

According to an embodiment, the first intermediate layer and the first upper layer may respectively include different transparent conductive materials.

According to an embodiment, the first intermediate layer may fill the trench.

According to an embodiment, each of the first lower layer and the first upper layer may have a uniform thickness.

According to an embodiment, the first pixel electrode may include a center area overlapping the trench and a peripheral area located outside the trench, and a thickness of the first intermediate layer in the center area may be greater than a thickness of the first intermediate layer in the peripheral area.

One or more embodiments provide a method of manufacturing (or providing) a display device, the method including forming (or providing) a via insulating layer on the substrate, forming a trench in the via insulating layer, and forming a pixel electrode arranged in the trench, where the forming of the pixel electrode may include forming a lower conductive layer with a uniform thickness in the trench, forming, on the lower layer, an intermediate layer including a transparent conductive material filling the trench, and forming, on the intermediate layer, an upper layer including a transparent conductive material.

According to an embodiment, in the forming of the trench, a via hole penetrating through the via insulating layer may be simultaneously formed with the trench.

According to an embodiment, the trench and the via hole may be formed through a halftone mask process.

According to an embodiment, the intermediate layer may include at least one of zinc oxide ($ZnO_x$), zinc tin oxide ($ZnSnO_x$), indium zinc oxide ($InZnO_x$), and molybdenum oxide ($MoO_x$).

According to an embodiment, the intermediate layer may be formed through an inkjet process.

According to an embodiment, the lower layer and the upper layer may be formed through a sputtering deposition process.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
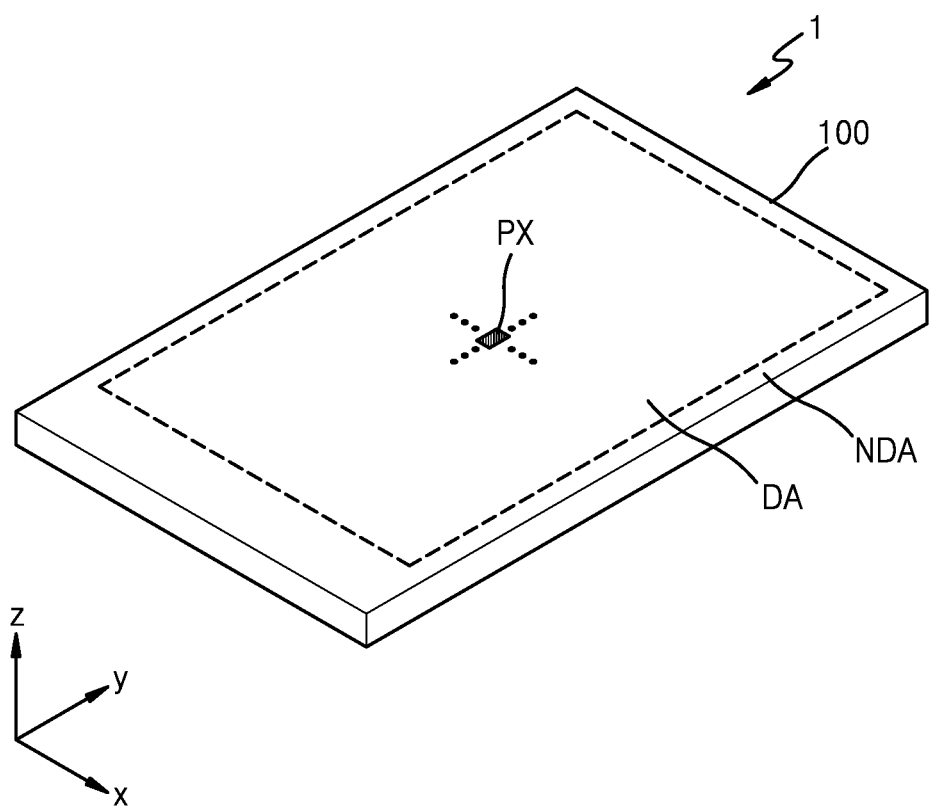
FIG. 1 is a perspective view schematically illustrating a display device according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows various modifications and may have various embodiments, specific embodiments will be shown in the drawings and described in detail in detailed descriptions. Effects and features of the disclosure, and methods of achieving the same will be clearly understood with reference to embodiments described in detail in conjunction with the accompanying drawings. However, the disclosure is not limited to the embodiments disclosed hereinafter and may be embodied in different forms.

Hereinafter, embodiments will be described in detail with reference to the accompanying drawings, and in descriptions with reference to the drawings, same reference numerals will be given to same or corresponding elements, and description thereof will not be repeatedly given.

In the following embodiments, terms such as first, second, etc. are only used to distinguish one element from others, not in a limiting sense.

In following embodiments, an expression used in the singular encompasses the expression of the plural, unless it has a clearly different meaning in the context. For example, a reference number labeling a singular form of an element within the figures may be used to reference a plurality of the singular element within the text of the disclosure.

In following embodiments, terms such as "include," "comprise," or "have" indicate the existence of the features or components disclosed in the specification, and are not intended to preclude the possibility that one or more other features or components may be added.

In following embodiments, it will be understood that when a component such as a layer, a film, an area, or a plate is referred to as being related to another component such as being "on" or "above" another component, the component may be directly on the other component or intervening components may be present thereon. In contrast, when a component such as a layer, a film, an area, or a plate is referred to as being related to another component such as being "directly on" or "directly above" another component, no other component or intervening component is present therebetween.

Sizes of components in the drawings may be exaggerated or reduced for convenience of explanation. For example, sizes and thicknesses of the components in the drawing are arbitrarily illustrated for convenience of explanation, and therefore, the embodiments are not limited to the illustration.

When an embodiment may be implemented differently, a specific process order may be performed differently from the described order. For example, two consecutively described processes may be performed substantially at the same time or performed in an order opposite to the described order.

In following embodiment, when it is referred that components such as layers, films, areas, and plates are related such as being "connected" to each other, the components may be directly connected to each other or may be indirectly connected to each other with intervening other components. For example, when components are electrically connected to each other, the components may be directly connected to each other, or may be indirectly connected to each other with other intervening components. In contrast, when it is referred that components such as layers, films, areas, and plates are related such as being "directly connected" to each other, no intervening component is therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A display device 1, which is a device configured to generate and/or display images, may include portable mobile devices such as a game player, a multimedia device, or a micro personal computer (PC). A display device 1 to be described later may include a liquid crystal display, an electrophoretic display, an organic light-emitting display, an inorganic light-emitting display, a field emission display, a surface-conduction electron-emitter display, a quantum dot display, a plasma display, a cathode ray display, and the like. Hereinafter, an organic light-emitting display device is described as an example of a display device 1 according to an embodiment. However, in embodiments, various types of display devices as described above may be used.

FIG. 1 is a perspective view schematically illustrating a display device 1 according to an embodiment.

Referring to FIG. 1, the display device 1 may include, on a substrate 100, a display area DA and a non-display area NDA.

The display area DA may implement images. A pixel PX provided in plural including a plurality of pixels PX may be arranged in the display area DA. Here, images may be provided using light generated and/or emitted from the pixels PX.

The non-display area NDA does not provide images. In an embodiment the pixels PX may not be arranged in the non-display area NDA. The non-display area NDA may be adjacent to the display area DA, and in an embodiment, may generally surround the display area DA. A driver and the like configured to provide electric signals or power to the pixels PX may be arranged in the non-display area NDA. The non-display area NDA may include a pad portion (not shown), at which electric elements outside of the display device 1 such as a printed circuit board, and the like may be electrically connected to the display device 1 or components thereof.

Figure 2:
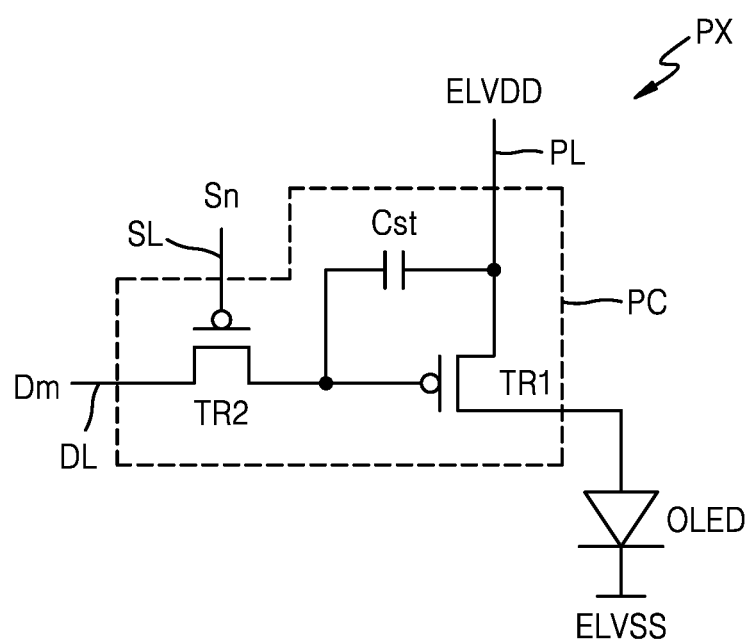
FIG. 2 is an equivalent circuit diagram of a pixel included in a display device according to an embodiment.

FIG. 2 is an equivalent circuit diagram of a pixel PX included in the display device 1 according to an embodiment.

Referring to FIG. 2, the pixel PX may include a pixel circuit PC, and a display element, e.g., an organic light-emitting diode OLED, which is connected to the pixel circuit PC. The pixel circuit PC may include a plurality of transistors such as a first thin-film transistor TR1 and a second thin-film transistor TR2, and a storage capacitor Cst. Each of the pixels PX may emit red, green, or blue light through the organic light-emitting diode OLED.

The second thin-film transistor TR2, which is a switching thin-film transistor, may be connected to a scan line SL and a data line DL as signal lines transmitting electrical signals, and may transmit a data voltage or a data signal Dm as an electrical signal, which is input from the data line DL, to the first thin-film transistor TR1, in response to a switching voltage or a switching signal Sn as an electrical signal input from the scan line SL. The storage capacitor Cst may be connected to the second thin-film transistor TR2 and a driving voltage line PL, and may store a voltage corresponding to a difference between a voltage transmitted from the second thin-film transistor TR2 and a first power voltage ELVDD provided to the driving voltage line PL.

The first thin-film transistor TR1, which is a driving thin-film transistor, may be connected to the driving voltage line PL and the storage capacitor Cst, and may control a driving current (e.g., electrical current) flowing through an organic light-emitting diode OLED from the driving voltage line PL, in response to a value of the voltage stored in the storage capacitor Cst. Due to the driving voltage, the organic light-emitting diode OLED may emit light having a certain luminance. A counter electrode (e.g., a cathode) of the organic light-emitting diode OLED may receive a second power voltage ELVSS.

Although a pixel circuit PC including two thin-film transistors and one of the storage capacitor Cst is described with reference to FIG. 2, in other embodiments, the number of thin-film transistors and the number of storage capacitors may be variously modified according to the design of the pixel circuit PC.

Figure 3:
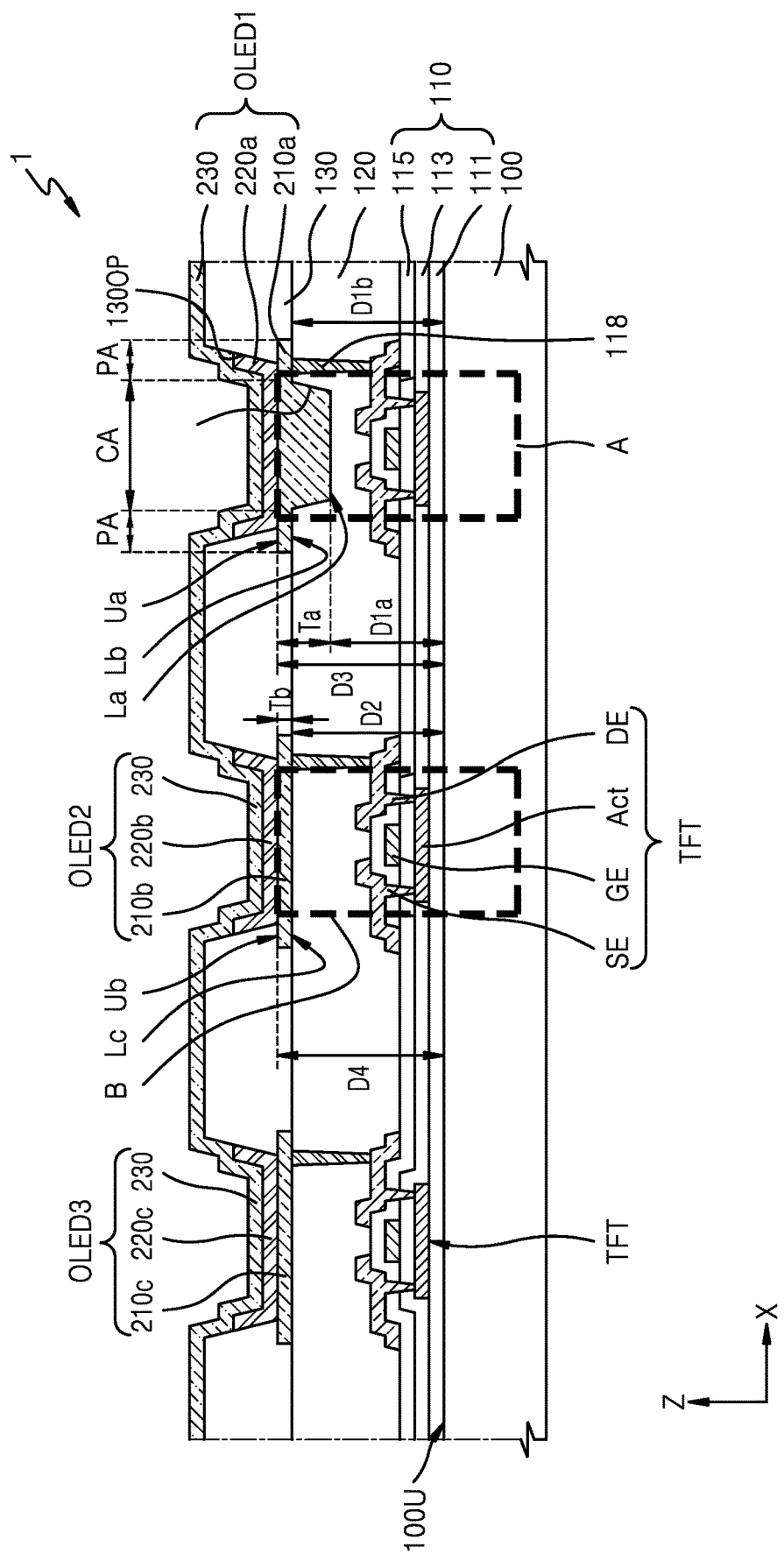
FIG. 3 is a cross-sectional view schematically illustrating a display device according to an embodiment.
Figure 4A:
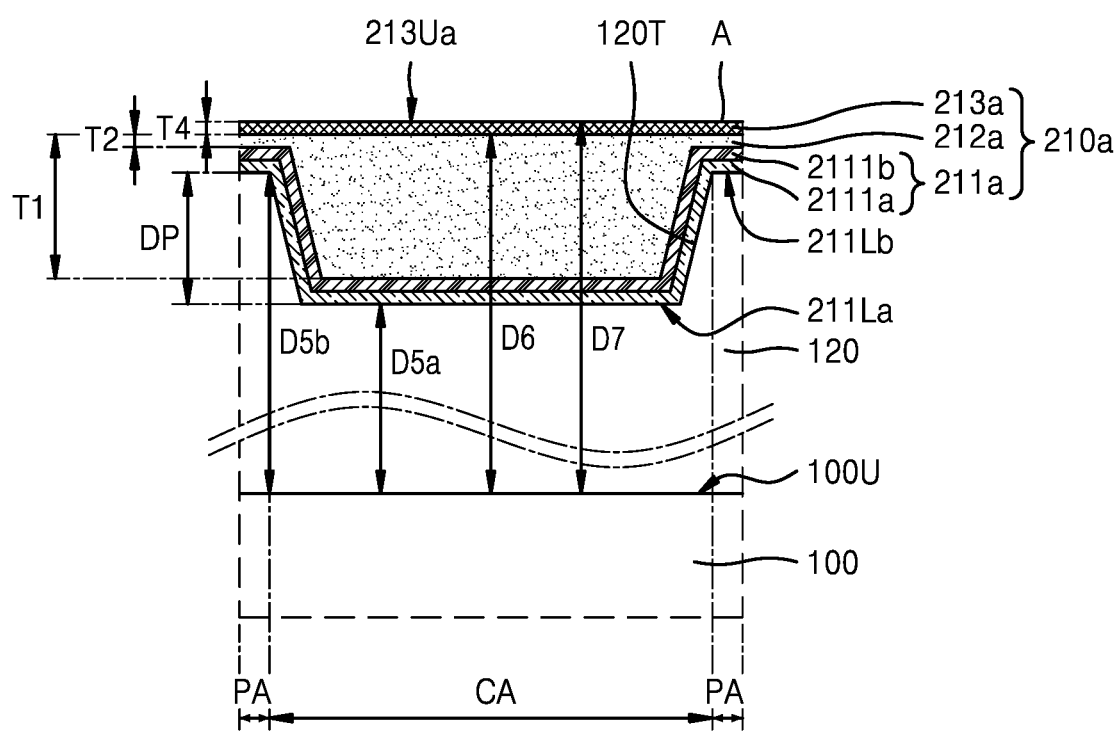
FIG. 4A is an enlarged view of a portion of a display device according to an embodiment.
Figure 4B:
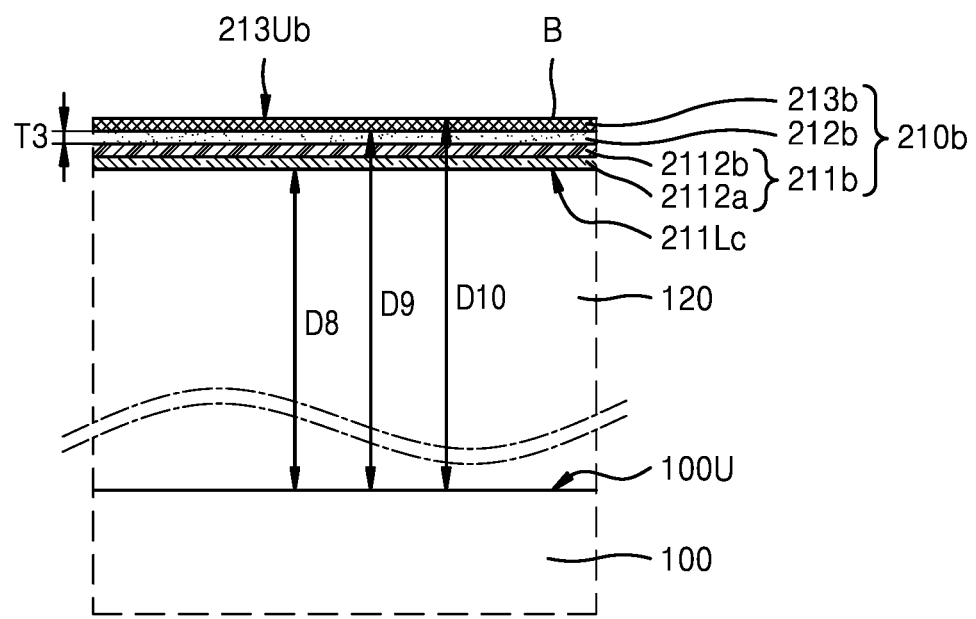
FIG. 4B is an enlarged view of a portion of a display device according to an embodiment.

FIG. 3 is a cross-sectional view schematically illustrating the display device 1 according to an embodiment. FIG. 4A is an enlarged view of an area A shown in FIG. 3 according to an embodiment. FIG. 4B is an enlarged view of an area B shown in FIG. 3 according to an embodiment.

Referring to FIGS. 3, 4A, and 4B, the display device 1 may include the substrate 100, a pixel circuit layer 110 above the substrate 100, a via insulating layer 120 above the pixel circuit layer 110, and a first organic light-emitting diode OLED1 as a first light emitting element, a second organic light-emitting diode OLED2 as a second light emitting element, and a third organic light-emitting diode OLED3 as a third light emitting element among a plurality of light emitting elements in a light emitting element layer disposed above the via insulating layer 120. The first organic light-emitting diode OLED1 may include a first pixel electrode 210a, a first emission layer 220a, and a counter electrode 230. The second organic light-emitting diode OLED2 may include a second pixel electrode 210b, a second emission layer 220b, and the counter electrode 230. The third organic light-emitting diode OLED3 may include a third pixel electrode 210c, a third emission layer 220c, and the counter electrode 230.

The first organic light-emitting diode OLED1, the second organic light-emitting diode OLED2, and the third organic light-emitting diode OLED3 may emit light having different colors from each other. The first organic light-emitting diode OLED1, the second organic light-emitting diode OLED2, and the third organic light-emitting diode OLED3 may emit at least one of red light, green light, or blue light. For example, the first organic light-emitting diode OLED1 may emit blue light, the second organic light-emitting diode OLED2 may emit green light, and the third organic light-emitting diode OLED3 may emit red light, but the embodiments are not limited thereto. Colors of light emitted by the respective organic light-emitting diodes may change.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate (TAC), cellulose acetate propionate, and the like.

The pixel circuit layer 110 may be disposed on the substrate 100. The pixel circuit layer 110 may include pixel circuits (e.g., a plurality of the pixel circuit PC) connected to the organic light-emitting diodes, and various insulating layers. The pixel circuit layer 110 may include a transistor such as at least one thin-film transistor TFT and a plurality of insulating layers (e.g., a buffer layer 111, a gate insulating layer 113, and an interlayer insulating layer 115).

The buffer layer 111 may be disposed between the substrate 100 and the thin-film transistor TFT. The buffer layer 111 may include an inorganic insulating material including silicon nitride, silicon oxynitride, and silicon oxide. The buffer layer 111 may include a single layer or multiple layers including the aforementioned inorganic insulating materials.

The thin-film transistor TFT may include a semiconductor layer Act, which may include polysilicon, amorphous silicon, an oxide semiconductor, an organic semiconductor, and the like. The semiconductor layer Act may include a channel area, and a drain area and a source area which are respectively arranged at two sides of the channel area (e.g., opposing sides in a direction along the substrate 100). The semiconductor layer Act may be a semiconductor pattern among a plurality of semiconductor patterns of an active layer of the pixel circuit layer 110.

A gate electrode GE may be disposed above the semiconductor layer Act, and the gate electrode GE may include a low-resistance metal material. The gate electrode GE may include a conductive material including molybdenum (Mo), aluminum (Al), copper (Cu), titanium (Ti), and the like, and may include a single layer or multiple layers including the aforementioned materials.

The gate insulating layer 113 between the semiconductor layer Act and the gate electrode GE may include an inorganic insulating material such as Si $O_2$, $SiN_x$, SiON, $Al_2O_3$, Ti $O_2$, $Ta_2O_5$, Hf $O_2$, Zn $O_2$, or the like.

The interlayer insulating layer 115 may be disposed on the gate electrode GE, and the interlayer insulating layer 115 may include Si $O_2$, $SiN_x$, SiON, $Al_2O_3$, Ti $O_2$, $Ta_2O_5$, $HfO_2$, $ZnO_2$, or the like. The interlayer insulating layer 115 may include a single layer or multiple layers including the aforementioned inorganic insulating materials.

A drain electrode DE and a source electrode SE may be on the interlayer insulating layer 115. The drain electrode DE and the source electrode SE may be respectively connected to the drain area and the source area of the semiconductor layer Act through contact holes provided in the gate insulating layer 113 and the interlayer insulating layer 115. The drain electrode DE and the source electrode SE may be in a same layer as each other. As being in a same layer, elements may be formed in a same process and/or as including a same material as each other, elements may be respective portions or patterns of a same material layer, elements may be on a same layer by forming an interface with a same underlying or overlying layer, etc., without being limited thereto.

The drain electrode DE and the source electrode SE may include highly conductive materials. The drain electrode DE and the source electrode SE may include conductive materials including Mo, Al, Cu, Ti, and the like, and may include a single layer or multiple layers including the aforementioned materials. As an embodiment, the drain electrode DE and the source electrode SE may each have a multi-layer structure including Ti/Al/Ti.

The via insulating layer 120 covering the thin-film transistor TFT may be disposed on the pixel circuit layer 110. The via insulating layer 120 may have or define a trench 120T. A sidewall or side surface of the via insulating layer 120 may connect upper surface portions of the via insulating layer 120 to each other and define the trench 120T together with the upper surface portion which is closer to the substrate 100 among the upper surface portions. As described with reference to FIG. 8, the trench 120T may include an area or volume formed (or provided) by removing a portion of the via insulating layer 120.

The trench 120T may be disposed in an area overlapping or corresponding to an emission area (e.g., a light emission area) defined by an opening 1300P of a pixel defining layer 130, in a direction perpendicular (or normal) to the substrate 100, e.g., the z direction. The trench 120T may have a planar dimension along a plane defined by a first direction (e.g., x direction) and a second direction (e.g., y direction) crossing each other. The planar dimension may include an area as a product of the first and second direction dimensions. A volume of the trench 120T may be a product of the planar area and a dimension along a third direction (e.g., the z direction). A thickness or depth of the display device 1 and various components or layers thereof may be taken along the third direction (e.g., the z direction) to define a thickness direction.

The trench 120T may have a first depth DP. The first depth DP of the trench 120T may indicate a depth of an area from which the via insulating layer 120 is removed. The first depth DP may indicate a difference in heights between portions of the upper surface of the via insulating layer 120 which are located along the substrate 100. In a first portion and a second portion of the via insulating layer 120 where the upper surface of the via insulating layer 120 is disposed at different heights relative to a reference surface or reference point, the first depth DP may indicate a difference in a distance between the upper surface at the first portion and the upper surface 100U of the substrate, and a distance between the upper surface at the second portion and the upper surface 100O of the substrate. That is, at different locations along the via insulating layer 120, a first thickness portion of the via insulating layer 120 may be greater than a second thickness portion thereof which is adjacent to the first thickness portion, and a difference between a first thickness of the first thickness portion and a second thickness of the second thickness portion may be the first depth DP.

The trench 120T may be arranged in an area overlapping the first emission layer 220a, the second emission layer 220b, and the third emission layer 220c in a direction perpendicular to the substrate, e.g., the z direction. The trench 120T may be referred to as a groove.

The via insulating layer 120 may include an organic insulating material, and may include a general-purpose polymer such as polymethylenemethacrylate (PMMA) or polystyrene (PS), a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a combination thereof.

A first pixel electrode 210a, a second pixel electrode 210b, a third pixel electrode 210c as patterns of a pixel electrode layer, and the pixel defining layer 130, may be disposed on the via insulating layer 120. The pixel defining layer 130 may include or define the opening 1300P exposing at least a portion of each of the first pixel electrode 210a, the second pixel electrode 210b, and the third pixel electrode 210c to outside the pixel defining layer 130. That is, at least a portion of surfaces of the first pixel electrode 210a, the second pixel electrode 210b, and the third pixel electrode 210c may be exposed to outside the pixel defining layer 130 by the opening 1300P defined in the pixel defining layer 130. In an embodiment, the area (e.g., a planar area or region) exposed by the opening 1300P of the pixel defining layer 130 may be defined as an emission area (e.g., a light emitting area). The pixel defining layer 130 may include an organic insulating material and/or an inorganic insulating material.

The first pixel electrode 210a, the second pixel electrode 210b, and the third pixel electrode 210c may be electrically connected to a circuit portion, such as the thin-film transistor TFT included in the pixel circuit layer 110, through a via conductive layer 118 formed in or provided in the via insulating layer 120. The via conductive layer 118 may be in the via insulating layer 120 by extending partially into or completely through the via insulating layer 120 along a thickness direction thereof.

The first pixel electrode 210a may overlap (or correspond to) the trench 120T of the via insulating layer 120, and the second pixel electrode 210b and the third pixel electrode 210c may not overlap the trench 120T of the via insulating layer 120 (e.g., be non-overlapping with the trench 120T). As not overlapping, elements may be adjacent to each other along a planar direction and may be spaced apart from each other along the planar direction without being limited thereto. In an embodiment, the third pixel electrode 210c may have a same structure and include same components as the second pixel electrode 210b. In the present embodiment, the third pixel electrode 210c is illustrated as having the same structure as the second pixel electrode 210b, but the embodiment is not limited thereto, and the third pixel electrode 210c may be modified to have a same structure and include same components as the first pixel electrode 210a.

The first pixel electrode 210a extends into the trench 120T from an upper surface of the via insulating layer 120, and may fill the trench 120T of the via insulating layer 120. The first pixel electrode 210a may include a center area CA overlapping the trench 120T and a peripheral area PA which is extended from the center area CA and located outside the trench 120T.

A level of a lower surface La of the first pixel electrode 210a at the center area CA may be lower than a level of a lower surface Lb of the first pixel electrode 210a at the peripheral area PA. As being lower, a respective lower surface portion may be closer to the substrate 100 than another respective lower surface portion. A level of a lower surface Lc of the second pixel electrode 210b which is closest to the substrate 100 may be higher than the level of the lower surface La of the first pixel electrode 210a in the center area CA, with respect to a reference such as the upper surface 100U of the substrate 100. An upper surface Ua of the first pixel electrode 210a and an upper surface Ub of the second pixel electrode 210b which are each furthest from the upper surface 100O of the substrate 100 within a respective pixel electrode, may have a substantially same level. That is, the upper surface Ua of the first pixel electrode 210a and the upper surface Ub of the second pixel electrode 210b may be coplanar with each other, without being limited thereto.

In the present specification, "level" may be defined as a vertical level indicating a distance between the upper surface 100O of the substrate 100 and a respective surface of a component in a direction perpendicular to the substrate 100, e.g., the z direction. That is, that a level of 'X' is lower than a level of 'Y' may indicate that a vertical distance between the upper surface of the substrate 100 and the 'X' may be smaller than a vertical distance between the upper surface of the substrate 100 and the 'Y'. In addition, that a level of 'X' is lower than a level of 'Y' may indicate that a vertical distance between the upper surface of the substrate 100 and the 'X' is greater than a vertical surface between the upper surface of the substrate 100 and the 'Y'. Furthermore, that a level of 'X' is substantially identical to a level of 'Y' may indicate that a vertical distance between the upper surface of the substrate 100 may be substantially identical to a vertical distance between the upper surface of the substrate 100 and the 'Y'. As being substantially identical, surfaces may be coplanar with each other, without being limited thereto.

A distance D1a (e.g., a first distance) between the lower surface La of the first pixel electrode 210a and the upper surface 100O of the substrate 100 in the center area CA, may be less than a distance D1b (e.g., a second distance) between the lower surface Lb of the first pixel electrode 210a and the upper surface 100U of the substrate 100 in the peripheral area PA. A distance D2 (e.g., a third distance) between the lower surface Lc of the second pixel electrode 210b and the upper surface 100O of the substrate 100, may be greater than the distance D1a between the lower surface La of the first pixel electrode 210a and the upper surface 100O of the substrate 100 in the center area CA. A distance D3 (e.g., a fourth distance) between the upper surface Ua of the first pixel electrode 210a and the upper surface 100U of the substrate 100, may be substantially identical (e.g., equal to) to a distance D4 (e.g., a fifth distance) between the upper surface Ub of the second pixel electrode 210b and the upper surface 100U of the substrate 100. The various distances may be a minimum distance at respective positions along the substrate 100, without being limited thereto.

A thickness Ta (e.g., a first thickness) of the first pixel electrode 210a may be greater than a thickness Tb (e.g., a second thickness) of the second pixel electrode 210b. The thicknesses Ta and Tb may be a maximum thickness at a respective area thereof. The thickness Ta of the first pixel electrode 210a (see FIG. 3) may be greater than a first depth DP of the trench 120T (see FIG. 4A). By forming the first pixel electrode 210a and the second pixel electrode 210b in different thicknesses, the number of Fine Metal Mask (FMM) processes may be reduced. By forming a first intermediate layer 212a of the first pixel electrode 210a, a resonance distance between a first lower layer 211a and a counter electrode 230 may be adjusted, and by doing so, the quality of the display device 1 may be improved. By doing so, an ultrahigh resolution display device having a resolution of 1600 pixels per inch (ppi) or higher, for example, a display device for VR or AR, may be provided. However, the use of the display device 1 of the disclosure is not limited thereto.

As shown in FIG. 4A, the first pixel electrode 210a may include the first lower layer 211a, the first intermediate layer 212a, and a first upper layer 213a, in order from the via insulating layer 120. The first pixel electrode 210a may include a reflective electrode. The first pixel electrode 210a may include a reflective film and a transparent or semi-transparent electrode layer formed on the reflective film.

The first lower layer 211a may be disposed at a lowermost portion of the first pixel electrode 210a. The first lower layer 211a may be disposed on the via insulating layer 120. The first lower layer 211a may be arranged in the trench 120T of the via insulating layer 120 and may extend outside the trench 120T. That is, the first lower layer 211a may be arranged in the center area CA, and a portion of the first lower layer 211a may extend from the center area CA to the peripheral area PA. A cross-sectional profile of the first lower layer 211a may be arranged according to a shape or profile of the trench 120T of the via insulating layer 120.

A level of a lower surface 211La of the first lower layer 211a at the center area CA may be lower than a level of a lower surface 211Lb of the first lower layer 211a at the peripheral area PA. A distance D5a between the lower surface 211La of the first lower layer 211a and the upper surface 100O of the substrate 100 in the center area CA, may be smaller than a distance D5b between the lower surface 211Lb of the first lower layer 211a and the upper surface 100O of the substrate 100 in the peripheral area PA. At least a portion of the first lower layer 211a may be arranged at a level lower than a level of a second lower layer 211b described with reference to FIG. 4B. A distance between at least a portion of a lower surface of the first lower layer 211a and the upper surface 100O of the substrate 100 may be smaller than a distance D8 between a lower surface 211Lc of the second lower layer 211b and the upper surface 100O of the substrate 100.

The first lower layer 211a may have a substantially uniform thickness in (or at) the center area CA and at the peripheral area PA. The first lower layer 211a may include a reflective film reflecting light.

The first lower layer 211a may include a plurality of layers. The first lower layer 211a may include a first layer 2111a (e.g., a first sub-layer) and a second layer 2111b (e.g., a second sub-layer) which is on the first layer 2111a. Each of the first layer 2111a and the second layer 2111b in the first lower layer 211a may have a substantially uniform thickness in the center area CA and the peripheral area PA. The first layer 2111a of the first lower layer 211a may be arranged according to the shape of the trench 120T of the via insulating layer 120. The second layer 2111b of the first lower layer 211a may also be arranged according to the shape of the trench 120T of the via insulating layer 120.

The first layer 2111a of the first lower layer 211a may include a conductive oxide material, for example, indium tin oxide (ITO), indium zinc oxide (IZO), zinc oxide (ZnO), indium oxide ($In_2O_3$), indium gallium oxide (IGO), aluminum zinc oxide (AZO), or the like. The second layer 2111b of the first lower layer 211a may include silver (Ag), magnesium (Mg), aluminum (Al), platinum (Pt), palladium (Pd), gold (Au), nickel (Ni), neodymium (Nd), iridium (Ir), chrome (Cr), or combinations thereof. Although the first lower layer 211a is illustrated as including two layers, the embodiment is not limited thereto, and the first lower layer 211a may include three or more layers as in the embodiment described with reference to FIG. 5A.

The first intermediate layer 212a may function as a distance adjustment layer for adjusting a resonance distance between the first pixel electrode 210a and the counter electrode 230. The first intermediate layer 212a may be disposed on the first lower layer 211a. The first intermediate layer 212a may be disposed between the first lower layer 211a and the first upper layer 213a. The first intermediate layer 212a may planarize the first lower layer 211a and provide a flat upper surface.

In an embodiment, in (or at) each of the center area CA and the peripheral area PA, the first intermediate layer 212a may be disposed between the first lower layer 211a and the first upper layer 213a. The first intermediate layer 212a may fill a gap within the trench 120T which is defined between the first lower layer 211a and the first upper layer 213a. In an embodiment, the first intermediate layer 212a may fill the trench 120T of the via insulating layer 120, and a portion of the first intermediate layer 212a may be arranged outside the trench 120T. That is, a portion of the first intermediate layer 212a may be arranged in the center area CA, and another portion of the first intermediate layer 212a may be arranged in the peripheral area PA.

Unlike the first lower layer 211a being arranged in a uniform thickness according to the shape of the trench 120T of the via insulating layer 120, the first intermediate layer 212a may be arranged to completely fill an empty space (e.g., the gap between layers) in the trench 120T. A thickness T1 of the first intermediate layer 212a in the center area CA may be greater than a thickness T2 of the first intermediate layer 212a in the peripheral area PA. The thickness T1 of the first intermediate layer 212a in the center area CA may be greater than a thickness T3 of a second intermediate layer 212b of the second pixel electrode 210b described with reference to FIG. 4B. The thickness T1 of the first intermediate layer 212a may be substantially identical to or greater than (e.g., greater than or equal to) the first depth DP of the trench 120T.

The first intermediate layer 212a may include a transparent conductive material (e.g., a first transparent conductive material). In an embodiment, the first intermediate layer 212a may include a transparent conductive material having a liquid phase. For example, the first intermediate layer 212a may include at least one of $ZnO_x$, $ZnSnO_x$, $InZnO_x$, and $MoO_x$.

The first upper layer 213a may be arranged at an uppermost portion of the first pixel electrode 210a. The first upper layer 213a may be disposed on the first intermediate layer 212a. The first upper layer 213a may contact the first intermediate layer 212a in the center area CA and the peripheral area PA. As being in contact, elements may form an interface therebetween. The first upper layer 213a may be arranged at a substantially same level in the center area CA and the peripheral area PA. A distance between an upper surface 213Ua of the first upper layer 213a in the center area CA and the upper surface 1000 of the substrate 100, may be substantially identical to a distance between the upper surface 213Ua of the first upper layer 213a at the peripheral area PA and the upper surface 1000 of the substrate 100.

The first upper layer 213a may have a substantially uniform thickness in the center area CA and the peripheral area PA. A thickness T4 of the first upper layer 213a may be in a range from about 50 angstroms (Å) to about 110 Å. When the thickness T4 of the first upper layer 213a exceeds the aforementioned range, in an etching process of forming the first pixel electrode 210a, a material for forming the first upper layer 213a may remain in areas other than the first pixel electrode 210a. In the embodiment, as the thickness T4 of the first upper layer 213a is formed within the aforementioned range and a thickness of the first pixel electrode 210a is adjusted by using the first intermediate layer 212a, no etching residue is generated, and therefore, the reliability in the display device may be improved.

The first upper layer 213a may include a transparent conductive material. The first upper layer 213a may include a transparent conductive material (e.g., a second transparent conductive material) different from the transparent conductive material of the first intermediate layer 212a. For example, the first upper layer 213a may include ITO, IZO, ZnO, $In_2O_3$, IGO, AZO, or the like.

As shown in FIG. 4B, the second pixel electrode 210b may include the second lower layer 211b, the second intermediate layer 212b, and a second upper layer 213b. The second pixel electrode 210b may include a reflective electrode. The second pixel electrode 210b may include a reflective film and a transparent or semi-transparent electrode layer formed on the reflective film.

The second lower layer 211b may be disposed at a lowermost portion of the second pixel electrode 210b. The second lower layer 211b may be disposed on the via insulating layer 120 so as not to overlap the trench 120T. The lower surface 211Lc of the second lower layer 211b may be arranged at a same level in any areas, such as along all positions of the second pixel electrode 210b in the planar direction. The distance D8 between the lower surface 211Lc of the second lower layer 211b and the upper surface 1000 of the substrate 100 may be uniform in any areas. The second lower layer 211b may be substantially even. The second lower layer 211b may have a substantially uniform thickness. The second lower layer 211b may include a reflective film reflecting light.

The second lower layer 211b may include a plurality of layers. The second lower layer 211b may include a first layer 2112a (e.g., a third sub-layer) and a second layer 2112b (e.g., a fourth sub-layer) which is on the first layer 2112a. Each of the first layer 2112a and the second layer 2112b of the second lower layer 211b may be substantially even. Each of the first layer 2112a and the second layer 2112b of the second lower layer 211b may have a substantially uniform thickness.

The second lower layer 211b may include materials identical to the materials of the first lower layer 211a. As described later with reference to FIGS. 10A and 10B the second lower layer 211b may be formed in a same process as the first lower layer 211a. The first layer 2112a of the second lower layer 211b may include same materials as the materials of the first layer 2111a of the first lower layer 211a. The second layer 2112b of the second lower layer 211b may include materials identical to the materials of the second layer 2112b of the first lower layer 211a. That is, the second lower layer 211b may be in a same layer as the first lower layer 211a, where the second lower layer 211b and the first lower layer 211a are respective portions of a same material layer.

As an embodiment, the first layer 2112a of the second lower layer 211b may include a conductive oxide, for example, ITO, IZO, ZnO, $In_2O_3$, IGO, AZO, or the like. The second layer 2112b of the second lower layer 211b may include Ag, Mg, Al, Pt, Pd, Au, Ni, Nd, Ir, Cr, or combinations thereof. Although the second lower layer 211b is illustrated as including two layers, the embodiment is not limited thereto, and the second lower layer 211b may include three or more layers as in the embodiment described with reference to FIG. 5B.

In an embodiment, the second intermediate layer 212b may be disposed on the second lower layer 211b. The second intermediate layer 212b may be disposed between the second lower layer 211b and the second upper layer 213b. In other embodiments, the second intermediate layer 212b may be omitted. The thickness T3 of the second intermediate layer 212b may be smaller than the thickness T1 of the first intermediate layer 212a in the center area CA. An average thickness of the second intermediate layer 212b may be smaller than an average thickness of the first intermediate layer 212a.

A distance D9 from the upper surface 100U of the substrate 100 to an upper surface of the second intermediate layer 212b may be substantially identical to a distance D6 from the upper surface 1000 of the substrate 100 to an upper surface of the first intermediate layer 212a.

The second intermediate layer 212b may include materials identical to the materials of the first intermediate layer 212a. As described later with reference to FIGS. 11A and 11B, the second intermediate layer 212b may be formed in a same process as a process of forming the first intermediate layer 212a. The second intermediate layer 212b may include a transparent conductive material. In an embodiment, the second intermediate layer 212b may include a liquid transparent conductive material. For example, the second intermediate layer 212b may include at least one of $ZnO_x$, $ZnSnO_x$, $InZnO_x$, and $MoO_x$.

The second upper layer 213b may be arranged at an uppermost portion of the second pixel electrode 210b. The second upper layer 213b may be disposed on the second intermediate layer 212b. A distance D10 from the upper surface 100U of the substrate 100 to an upper surface 213Ub of the second upper layer 213b may be substantially identical to a distance D7 from the upper surface 1000 of the substrate 100 to the upper surface 213Ua of the first upper layer 213a. The second upper layer 213b may have a substantially uniform thickness.

The second upper layer 213b may include materials identical to the materials of the first upper layer 213a. As described later with reference to FIGS. 12A and 12B, the second upper layer 213b may be formed in a same process as a process of forming the first upper layer 213a. The second upper layer 213b may include a transparent conductive material. The second upper layer 213b may include transparent conductive materials different from the materials of the second intermediate layer 212b. For example, the second upper layer 213b may include ITO, IZO, ZnO, $In_2O_3$, IGO, AZO, and the like.

The first emission layer 220a, the second emission layer 220b, and the third emission layer 220c may be formed to respectively correspond to the first pixel electrode 210a, the second pixel electrode 210b, and the third pixel electrode 210c. The first emission layer 220a may be disposed between the first pixel electrode 210a and the counter electrode 230. The second emission layer 220b may be disposed between the second pixel electrode 210b and the counter electrode 230. The third emission layer 220c may be disposed between the third pixel electrode 210c and the counter electrode 230. The first emission layer 220a, the second emission layer 220b, and the third emission layer 220c may emit light having certain colors. As an embodiment, the first emission layer 220a, the second emission layer 220b, and the third emission layer 220c may include a high-molecular organic material or a low-molecular organic material. That is, the first emission layer 220a, the second emission layer 220b, and the third emission layer 220c may include an organic emission layer. As an embodiment, the first emission layer 220a, the second emission layer 220b, and the third emission layer 220c may include an inorganic emission material or quantum dots.

A first function layer (not shown) and a second function layer (not shown) may be respectively disposed under and on the first emission layer 220a, the second emission layer 220b, and the third emission layer 220c. The first function (or functional) layer may include, for example, a hole transport layer (HTL), or may include an HTL and a hole injection layer (HIL). As a component disposed on the first emission layer 220a, the second emission layer 220b, and the third emission layer 220c, the second function layer may include an electron transport layer (ETL) or an electron injection layer (EIL). The first function layer and/or the second function layer may include common layers generally covering the substrate 100, like the counter electrode 230 to be described hereinafter.

The counter electrode 230 may be commonly disposed on the first pixel electrode 210a, the second pixel electrode 210b, and the third pixel electrode 210c, and may overlap the first pixel electrode 210a, the second pixel electrode 210b, and the third pixel electrode 210c. The counter electrode 230 may include a conductive material having a small work function. For example, the counter electrode 230 may include a (semi)transparent layer including Ag, Mg, Al, Pt, Pd, Au, Ni, Nd, Ir, Cr, Li, Ca, or alloys thereof. Alternatively, the counter electrode 230 may further include a layer including ITO, IZO, ZnO, or $In_2O_3$ on the (semi)transparent layer including the aforementioned material. The counter electrode 230 may be integrally formed to generally cover the substrate 100.

Regarding the display device 1 to be described later, same reference numerals as those of FIGS. 3 to 4B indicate same components, and therefore, descriptions will not be repeatedly given, and only modifications will be described.

Figure 5A:
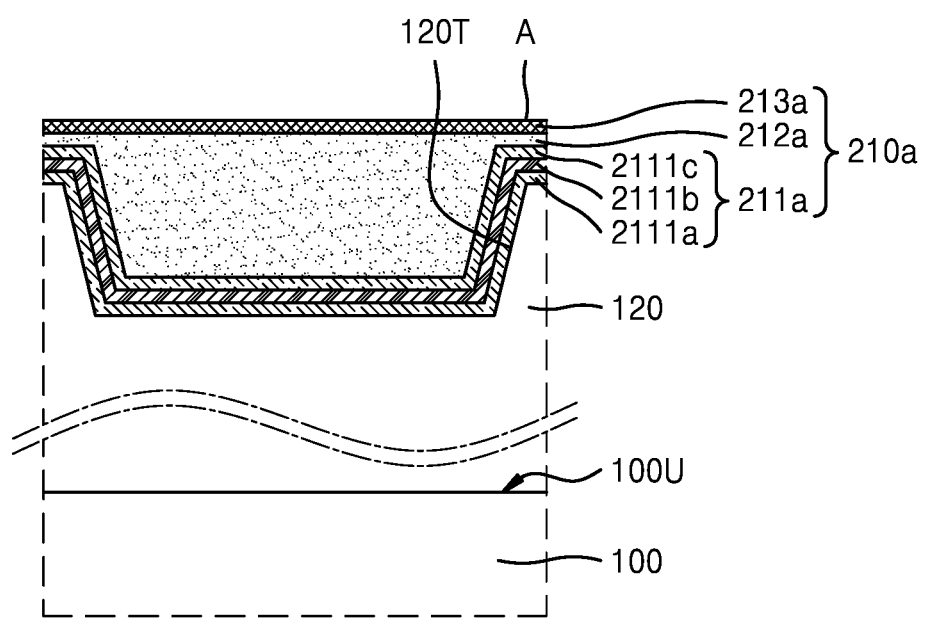
FIG. 5A is an enlarged view of a portion of a display device according to an embodiment.
Figure 5B:
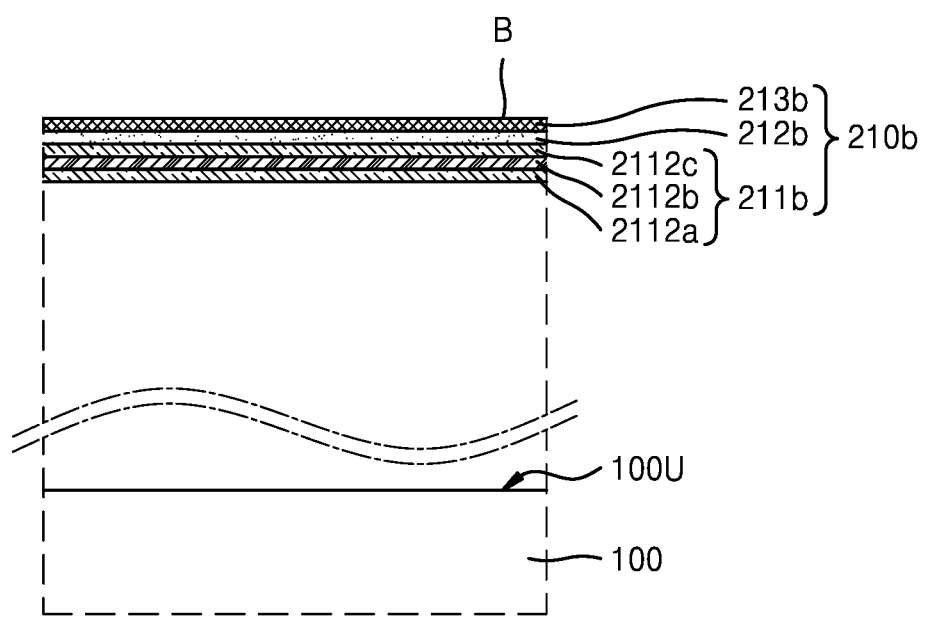
FIG. 5B is an enlarged view of a portion of a display device according to an embodiment.

FIG. 5A is an enlarged view of an embodiment of an area corresponding to area A shown in FIG. 3. FIG. 5B is an enlarged view of an embodiment of an area corresponding to area B shown in FIG. 3.

Referring to FIGS. 5A and 5B, the first lower layer 211a may include the first layer 2111a, the second layer 2111b on the first lower layer 211a, and a third layer 2111c (e.g., a third sub-layer) on the second layer 2111b. The second lower layer 211b may include the first layer 2112a, the second layer 2112b on the first layer 2112a, and a third layer 2112c on the second layer 2112b.

The first lower layer 211a and the second lower layer 211b may include a reflective film reflecting light.

The first layer 2111a of the first lower layer 211a may be arranged according to the shape of the trench 120T of the via insulating layer 120. The second layer 2111b of the first lower layer 211a may also be arranged according to the shape of the trench 120T of the via insulating layer 120. The third layer 2111c of the first lower layer 211a may be arranged according to the shape of the trench 120T of the via insulating layer 120. The first layer 2111a, the second layer 2111b, and the third layer 2111c of the first lower layer 211a may each have a substantially uniform thickness.

The first layer 2112a, the second layer 2112b, and the third layer 2112c of the second lower layer 211b may be substantially even. The first layer 2112a, the second layer 2112b, and the third layer 2112c of the second lower layer 211b may each have a substantially uniform thickness.

The first lower layer 211a and the second lower layer 211b may include same materials. Similar to the description with reference to FIGS. 10A and 10B, the second lower layer 211b may be formed in a same process as a process of forming the first lower layer 211a, that is, may be in a same layer within the respective pixel electrodes.

The first layer 2111a of the first lower layer 211a may include same materials as the materials of the first layer 2111a of the second lower layer 211b. The second layer 2111b of the first lower layer 211a may include same materials as the materials of the second layer 2111b of the second lower layer 211b. The third layer 2111c of the first lower layer 211a may include same materials as the materials of the third layer 2111c of the second lower layer 211b.

As an embodiment, the first layer 2111a of the first lower layer 211a and the first layer 2112a of the second lower layer 211b may include conductive oxide materials, for example, TIO, IZO, ZnO, $In_2O_3$, IGO, AZO, and the like. The second layer 2111b of the first lower layer 211a and the second layer 2112b of the second lower layer 211b may include Ag, Mg, Al, Pt, Pd, Au, Ni, Nd, Ir, Cr, or combinations thereof. The third layer 2111c of the first lower layer 211a and the third layer 2112c of the second lower layer 211b may include conductive oxide materials, for example, ITO, IZO, ZnO, IGO, AZO, or the like.

Figure 6A:
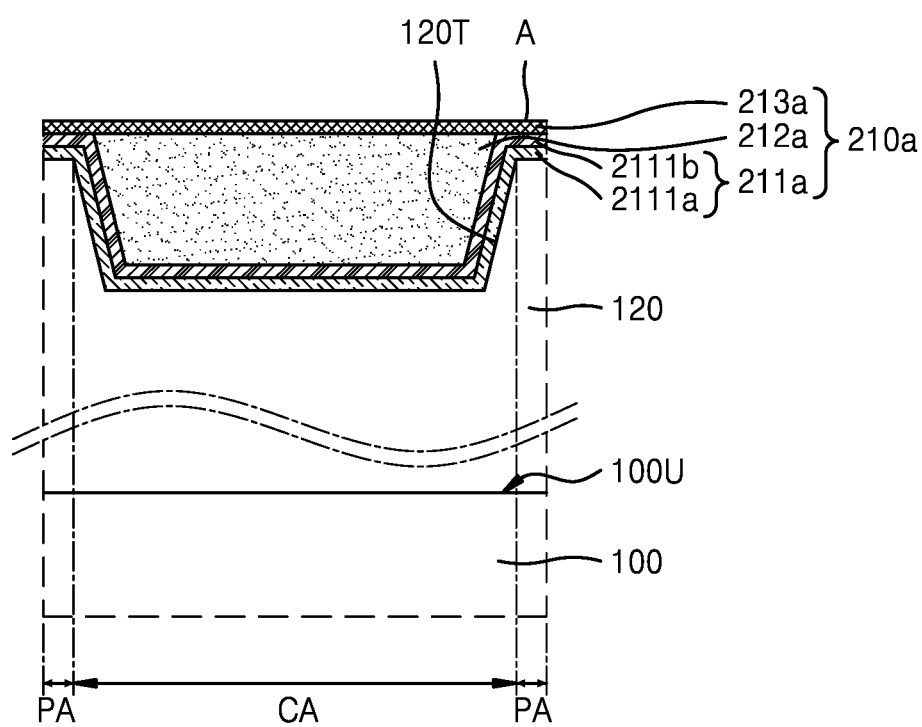
FIG. 6A is an enlarged view of a portion of a display device according to an embodiment.
Figure 6B:
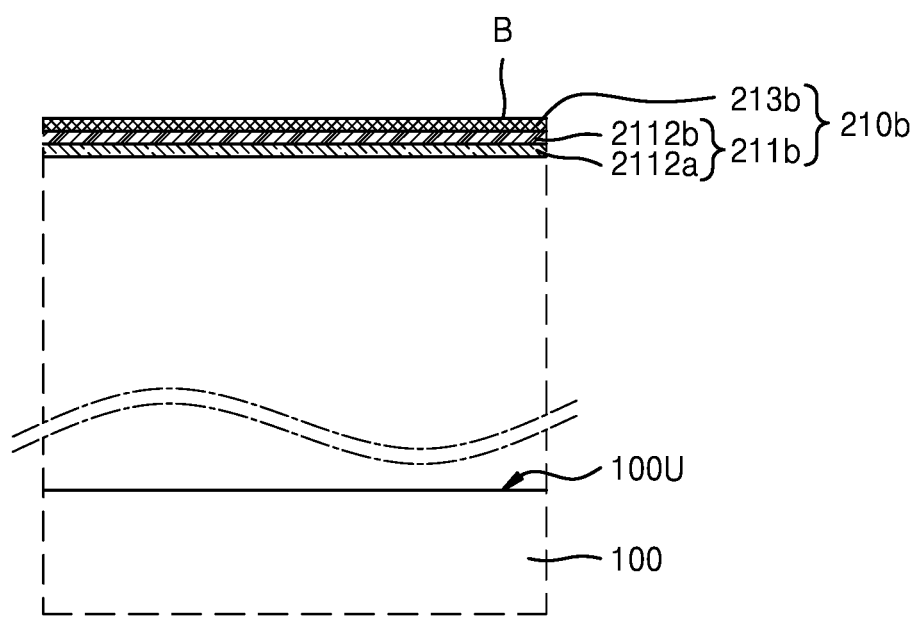
FIG. 6B is an enlarged view of a portion of a display device according to an embodiment.

FIG. 6A is an enlarged view of an embodiment of an area corresponding to the area A shown in FIG. 3. FIG. 6B is an enlarged view of an embodiment of an area corresponding to the area B shown in FIG. 3.

Referring to FIGS. 6A and 6B, the first intermediate layer 212a may be arranged only in the center area CA. The first intermediate layer 212a may be arranged only in an area overlapping the trench 120T. The first intermediate layer 212a may be not arranged in the peripheral area PA, that is, omitted from the peripheral area PA. An edge or end of the first intermediate layer 212a may be spaced apart from the peripheral area PA. Where a boundary is defined between the center area CA and the peripheral area PA, the edge or end of the first intermediate layer 212a may coincide with or be aligned with the boundary, or may be space apart from the boundary.

The first intermediate layer 212a may be disposed between the first lower layer 211a and the first upper layer 213a. In an embodiment, the first intermediate layer 212a may be arranged between the first lower layer 211a and the first upper layer 213a in the center area CA, and may be not arranged in the peripheral area PA. In an embodiment, a portion of the first upper layer 213a may contact the first intermediate layer 212a in the center area CA. In an embodiment, a portion of the first upper layer 213a may contact the first lower layer 211a. For example, the first upper layer 213a may form an interface with both the first intermediate layer 212a and the first lower layer 211a.

In an embodiment, a level of the upper surface of the first intermediate layer 212a may be substantially identical to a level of an uppermost surface of the first lower layer 211a. A distance between the upper surface of the first intermediate layer 212a and the upper surface 100U of the substrate 100 may be substantially identical to a distance between the uppermost surface of the first intermediate layer 212a and the upper surface 100U of the substrate 100. Here, the uppermost surface may be defined as a portion that is in a greatest distance from the upper surface 100U of the substrate 100.

In the present embodiment, the second pixel electrode 210b may not include the second intermediate layer 212b of the embodiment described with reference to FIGS. 4A and 4B. In an embodiment, the second lower layer 211b may contact the second upper layer 213b, such as forming an interface along an entirety of the second pixel electrode 210b.

According to the present embodiment, in a process of forming the intermediate layer to be described later with reference to FIGS. 11A and 11B, the intermediate layer may be formed by filling the materials of the intermediate layer only in the area overlapping the trench 120T such that the material does not overflow the trench 120T.

Figure 7:
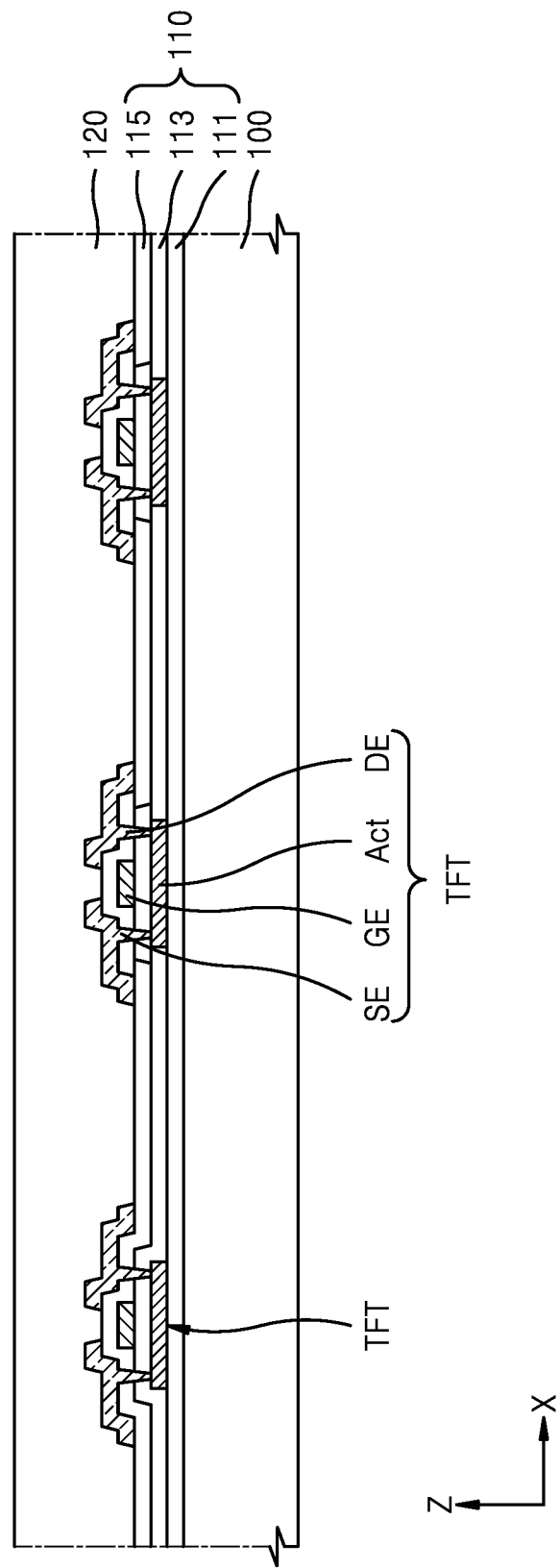
FIGS. 7 to 12B are cross-sectional views schematically illustrating a method of manufacturing (or providing) a display device, according to an embodiment.

FIG. 7 is a cross-sectional view schematically illustrating a method of manufacturing (or providing) the display device 1 according to an embodiment in an area corresponding to FIG. 3.

Referring to FIG. 7, the substrate 100 may be formed (or provided), and the pixel circuit layer 110 including the thin-film transistor TFT may be formed on the substrate 100. Next, the via insulating layer 120 may be formed on the pixel circuit layer 110. The via insulating layer 120 may include an organic insulating material, and may include a general-purpose polymer such as polymethylenemethacrylate (PMMA) or polystyrene (PS), a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a combination thereof.

Figure 8:
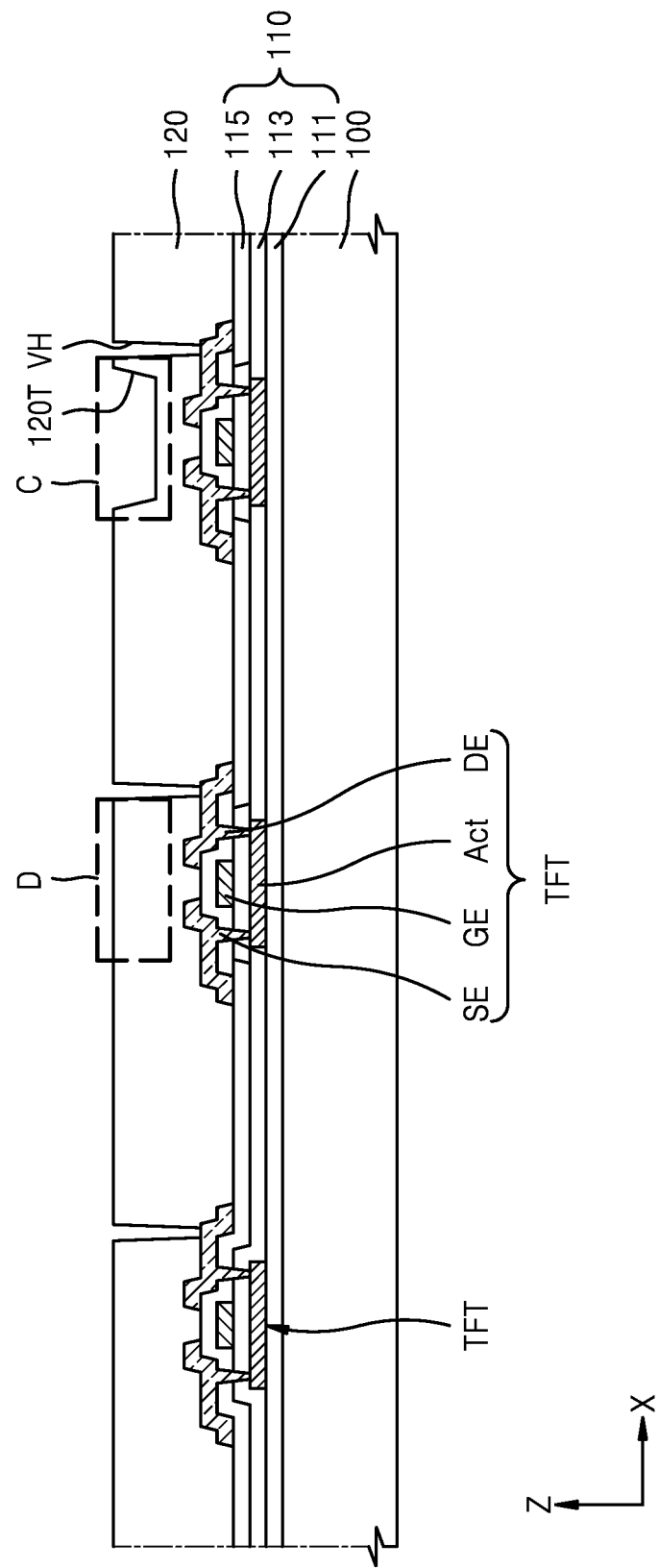
Figure 9A:
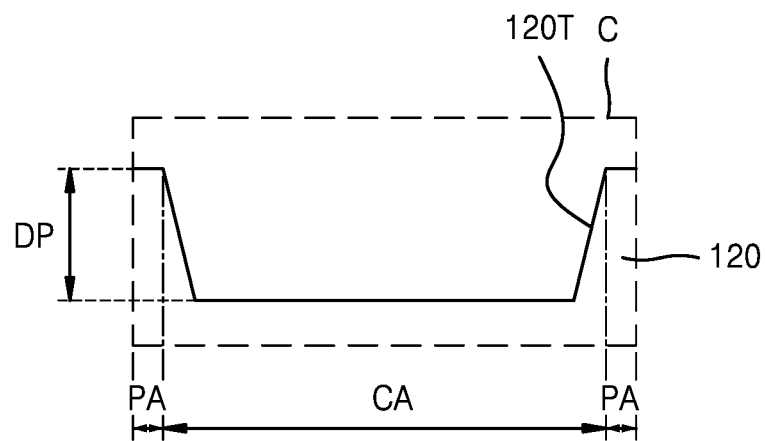
Figure 9B:
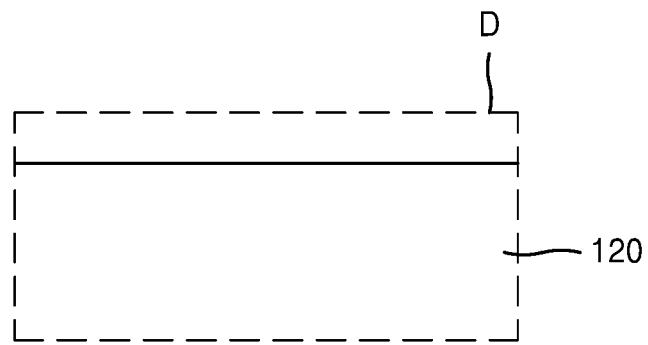

FIG. 8 is a cross-sectional view schematically illustrating a method of manufacturing the display device 1 according to an embodiment in the area corresponding to FIG. 3. FIG. 9A is an enlarged view of area C shown in FIG. 8. FIG. 9B is an enlarged view of area D shown in FIG. 8. The area C and the area D shown in FIG. 8 respectively correspond to the area A and area B shown in FIG. 3.

Referring to FIGS. 8, 9A, and 9B, the trench 120T may be formed in the via insulating layer 120. Here, a via hole VH penetrating through the via insulating layer 120 may be simultaneously formed with the trench 120T. The via hole VH may be open at both upper and lower surfaces of the via insulating layer 120, so as to extend completely through a thickness of the via insulating layer 120. The via hole VH may be formed in an area corresponding to an area described with reference to FIG. 3, in which the via conductive layer 118 is arranged. The via hole VH may expose a portion of the thin-film transistor TFT. Unlike the via hole VH, the trench 120T may have the shape of a groove that does not penetrate through the via insulating layer 120. That is, the trench 120T may be open at an upper surface of the via insulating layer 120 to extend into a partial thickness of the via insulating layer 120. The first depth DP may be formed extended from the upper surface of the via insulating layer 120. The trench 120T and the via hole VH may be etched to difference depths or heights due to a halftone mask process.

Figure 10A:
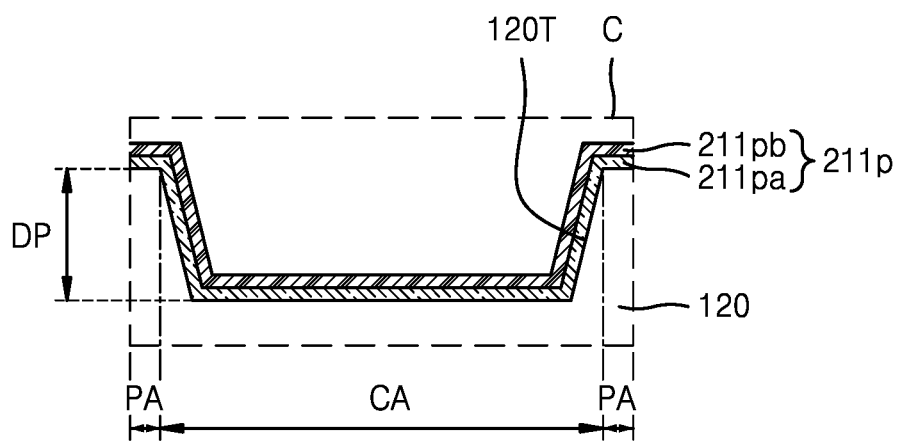
Figure 10B:
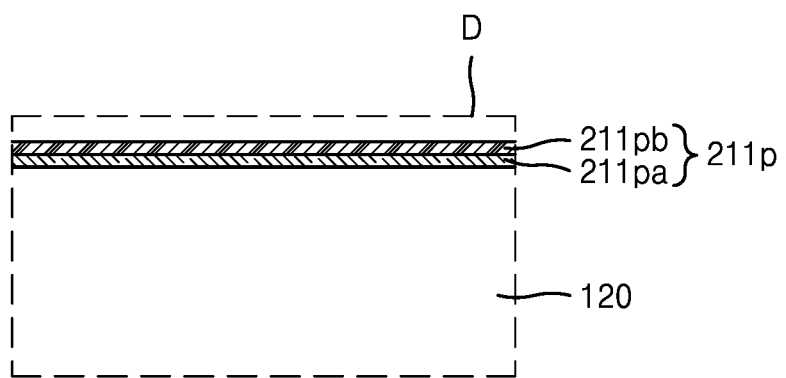

FIG. 10A is an enlarged view schematically illustrating a method of manufacturing the display device 1 according to an embodiment in an area corresponding to the area C shown in FIG. 8. FIG. 10B is an enlarged view schematically illustrating a method of manufacturing the display device according to an embodiment in an area corresponding to the area D shown in FIG. 8.

Referring to FIGS. 10A and 10B after forming the trench 120T, a lower conductive layer 211p may be formed (or provided) on the via insulating layer 120. The lower conductive layer 211p may be formed through a sputtering deposition process. The lower conductive layer 211p may be formed in a uniform thickness across light emission areas. The lower conductive layer 211p may include preliminary lower conductive layers respectively manufactured into the first lower layer 211a (see FIG. 4A) and the second lower layer 211b (see FIG. 4B) through following processes.

The lower conductive layer 211p may include a plurality of layers, e.g., two layers or three or more layers (e.g., a plurality of sub-layers). For example, the lower conductive layer 211p may include a first layer 211pa and a second layer 211pb. The first layer 211pa and the second layer 211pb may each be formed through a sputtering deposition process. The first layer 211pa and the second layer 211pb may each be formed in a uniform thickness.

The first layer 211pa of the lower conductive layer 211p may include a conductive oxide, for example, ITO, IZO, ZnO, In$_2$O$_3$, IGO, AZO, or the like. The second layer 211pb of the lower conductive layer 211p may include Ag, Mg, Al, Pt, Pd, Au, Ni, Nd, Ir, Cr, or a combination thereof. In an embodiment, the first layer 211pa and the second layer 211pb of the lower conductive layer 211p may respectively form or correspond to the first layer patterns 2111a and 2112a (e.g., first sub-layers) and the second layer patterns 2111b and 2112b (e.g., second sub-layers).

According to an embodiment, a third layer (not shown) including a conductive oxide may be further formed on the second layer 211pb. In an embodiment, the third layer within the method may correspond to the third layer patterns 2111c and 2112c (e.g., third sub-layers) in FIGS. 4A and 4B.

Figure 11A:
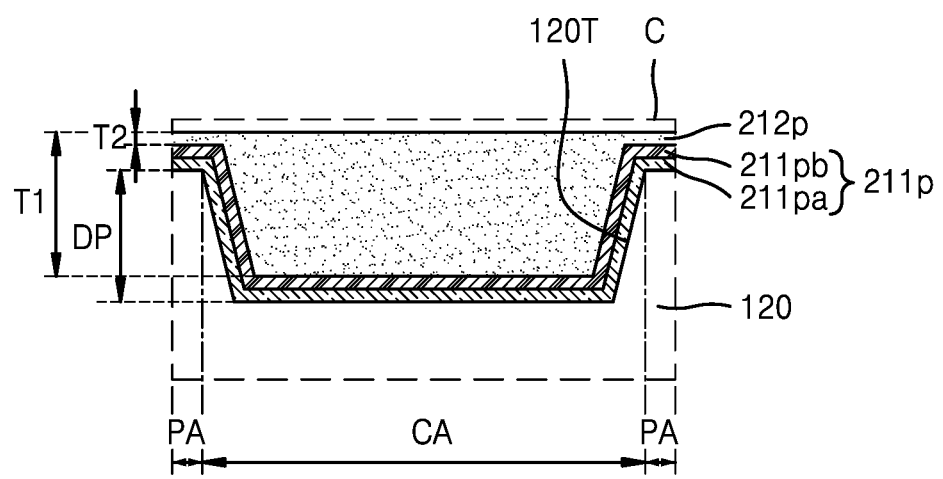

FIG. 11A is an enlarged view schematically illustrating a method of manufacturing the display device 1 according to an embodiment in an area corresponding to the area C shown in FIG. 8. FIG. 11B is an enlarged view schematically illustrating a method of manufacturing the display device 1 according to an embodiment in an area corresponding to the area D shown in FIG. 8.

Figure 11B:
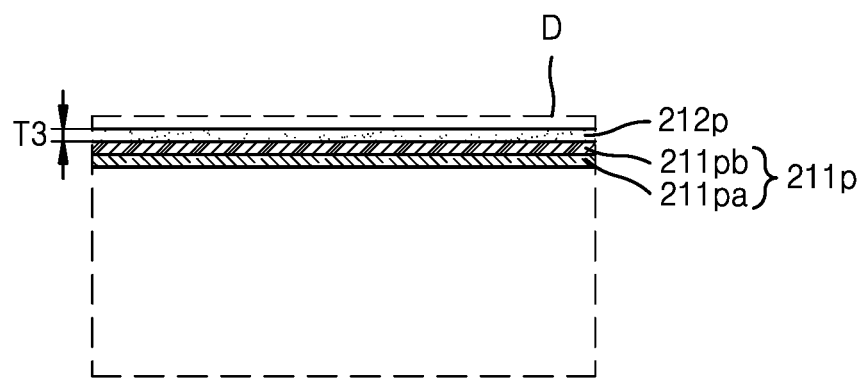

Referring to FIGS. 11A and 11B, an intermediate conductive layer 212p may be formed on the lower conductive layer 211p. The intermediate conductive layer 212p may fill the trench 120T. The intermediate conductive layer 212p may entirely fill an empty space in the trench 120T which corresponds to the above-described gap. The intermediate conductive layer 212p may be formed in a thickness T1 substantially identical to or greater than the first depth DP of the trench 120T.

The intermediate conductive layer 212p may be formed through an inkjet process. The intermediate conductive layer 212p may include a transparent conductive material having a liquid phase. For example, the first intermediate layer 212a may include at least one of $ZnO_x$, $ZnSnO_x$, $InZnO_x$, and $MoO_x$. After forming the intermediate conductive layer 212p, a hard-bake process may be performed. The intermediate conductive layer 212p may include preliminary intermediate conductive layers respectively manufactured into the first intermediate layer 212a (see FIG. 4A) and the second intermediate layer 212b (see FIG. 4B) through following processes.

As a resonance distance between the first lower layer 211a (see FIG. 4A) and the counter electrode 230 (see FIG. 3) is adjusted by forming the intermediate conductive layer 212p filling the trench 120T, the difficulty and cost in the processes of the method of manufacturing the display device may be reduced.

In an embodiment, the intermediate conductive layer 212p may be formed in a thickness greater than a depth of the trench 120T. When the intermediate conductive layer 212p is formed in a thickness greater than the depth of the trench 120T, the intermediate conductive layer 212p may be disposed on the lower conductive layer 211p in an area not overlapping the trench 120T. Here, the thickness T1 of the intermediate conductive layer 212p in the center area CA overlapping the trench 120T may be greater than the thickness T2 of the intermediate conductive layer 212p in the peripheral area PA not overlapping the trench 120T.

In other embodiments, the intermediate conductive layer 212p may be formed in a thickness substantially identical to the depth of the trench 120T (see FIG. 6A). In this case, the intermediate conductive layer 212p may be arranged only in the center area CA overlapping the trench 120T and may be not arranged in the peripheral area PA outside the trench 120T.

Figure 12A:
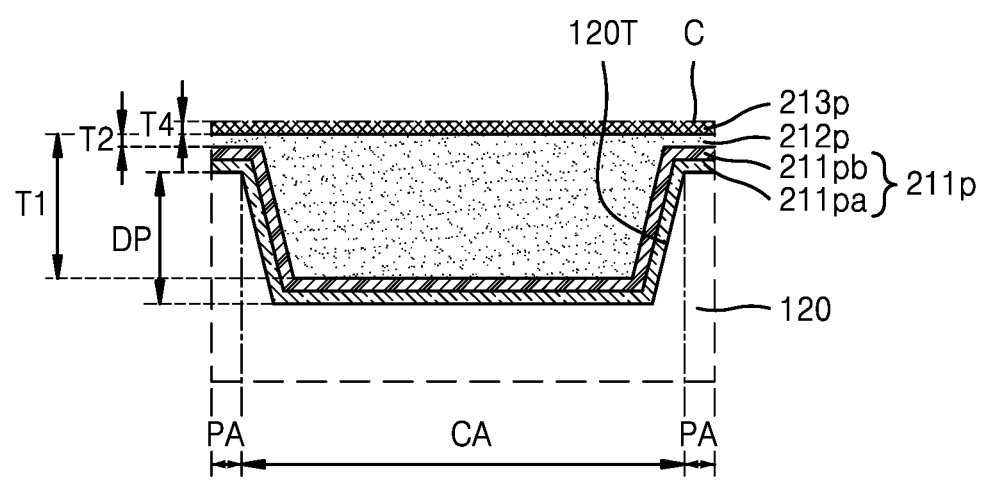
Figure 12B:
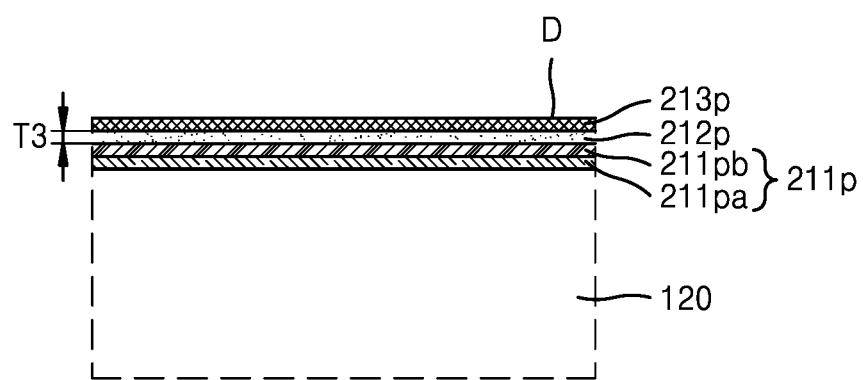

FIG. 12A is an enlarged view schematically illustrating a method of manufacturing the display device 1 according to an embodiment in an area corresponding to the area C shown in FIG. 8. FIG. 12B is an enlarged view schematically illustrating a method of manufacturing the display device 1 according to an embodiment in an area corresponding to the area D shown in FIG. 8.

Referring to FIGS. 12A and 12B, an upper conductive layer 213p may be formed on the intermediate conductive layer 212p. The upper conductive layer 213p may be formed through a sputtering deposition method. The upper conductive layer 213p may be formed in a uniform thickness. The upper conductive layer 213p may include preliminary upper layers respectively manufactured into the first upper layer 213a (see FIG. 4A) and the second upper layer 213b (see FIG. 4B) through following processes.

The upper conductive layer 213p may include a transparent conductive material different from the transparent conductive material included in the intermediate conductive layer 212p. The upper conductive layer 213p may include, for example, ITO, IZO, ZnO, $In_2O_3$, IGO, AZO, or the like.

The thickness T4 of the upper conductive layer 213p may range from about 50 Å to about 110 Å. When the thickness T4 of the upper conductive layer 213p is greater than the aforementioned range, the upper conductive layer 213p may remain in areas other than an area corresponding to the first pixel electrode 210a, the second pixel electrode 210b, and the third pixel electrode 210c (see FIG. 3). In the present embodiment, the thickness of the first pixel electrode 210a (see FIG. 3) is adjusted using the intermediate conductive layer 212p, and therefore, the upper conductive layer 213p may be formed in a relatively small thickness. By doing so, generation of etching residues may be prevented.

Referring again to FIGS. 3 to 4B, the first pixel electrode 210a, the second pixel electrode 210b, and the third pixel electrode 210c may be formed by etching a portion of each of the lower conductive layer 211p, the intermediate conductive layer 212p, and the upper conductive layer 213p. That is, a single pixel electrode may include a portion of the lower conductive layer 211p together with a portion of the intermediate conductive layer 212p, and a portion of the upper conductive layer 213p. The first pixel electrode 210a may be formed in an area overlapping the trench 120T, and the second pixel electrode 210b may be formed in an area not overlapping the trench 120T.

According to embodiments, by forming pixel electrodes filling a trench in an insulating layer and applying a resonance structure, the reliability in the display device 1 may be improved, and manufacturing cost of the display device 1 may be reduced. However, the scope of the embodiments are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate comprising an upper surface;
a pixel circuit layer on the substrate and comprising a transistor;
an insulating layer on the pixel circuit layer, the insulating layer defining a trench having a depth; and
a first pixel electrode connected to the pixel circuit layer, the first pixel electrode having a thickness which is greater than the depth of the trench,
wherein the first pixel electrode comprises:
a center area overlapping the trench, and a peripheral area which is adjacent to the center area,
a lower surface corresponding to the center area and to the peripheral area, and
a distance from the lower surface of the first pixel electrode to the upper surface of the substrate, in the center area, being smaller than a distance between the lower surface of the first pixel electrode and the upper surface of the substrate, in the peripheral area.

2. The display device of claim 1, wherein the first pixel electrode further comprises:
a lower layer,
an intermediate layer comprising a first transparent conductive material, on the lower layer, the first transparent conductive material having a thickness greater than or equal to the depth of the trench, and
an upper layer on the intermediate layer.

3. The display device of claim 2, wherein the intermediate layer comprises at least one of zinc oxide, indium tin oxide, indium zinc oxide and molybdenum oxide.

4. The display device of claim 2, wherein the upper layer comprises a second transparent conductive material different from the first transparent conductive material in the intermediate layer.

5. The display device of claim 2, wherein
the intermediate layer corresponds to the center area and to the peripheral area, and
a thickness of the intermediate layer in the center area is greater than a thickness of the intermediate layer in the peripheral area.

6. The display device of claim 2, wherein the intermediate layer is only in the center area.

7. The display device of claim 2, wherein
the lower layer corresponds to the center area and to the peripheral area, and
the lower layer has a uniform thickness in the center area and in the peripheral area.

8. The display device of claim 2, wherein
the upper layer corresponds to the center area and to the peripheral area, and
the upper layer has a uniform thickness in the peripheral area and in the center area.

9. The display device of claim 1, further comprising a pixel electrode layer including:
the first pixel electrode corresponding to the trench, and
a second pixel electrode non-overlapping the trench.

10. The display device of claim 9, wherein
the second pixel electrode includes a lower surface which is closest to the upper surface of the substrate, and
a distance between the lower surface of the second pixel electrode and the upper surface of the substrate is greater than a distance between the lower surface of the first pixel electrode at the center area and the upper surface of the substrate.

11. The display device of claim 9, wherein
each of the first pixel electrode and the second pixel electrode includes an upper surface which is furthest from the upper surface of the substrate, and
a distance between the upper surface of the second pixel electrode and the upper surface of the substrate is equal to a distance between the upper surface of the first pixel electrode and the upper surface of the substrate.

12. The display device of claim 9, wherein the pixel electrode layer further includes:
a lower layer, an upper layer, and an intermediate layer between the lower layer and the upper layer,
the first pixel electrode comprising a first lower layer of the lower layer, a first intermediate layer of the intermediate layer, and a first upper layer of the upper layer, the first intermediate layer filling the trench, and
the second pixel electrode comprises a second lower layer of the lower layer and a second upper layer of the upper layer.

13. The display device of claim 12, wherein
the upper layer of the pixel electrode layer has an upper surface at the first pixel electrode and at the second pixel electrode, and
a distance between the upper surface of the first upper layer in the first pixel electrode and the upper surface of the substrate is equal to a distance between the upper surface of the second upper layer in the second pixel electrode and the upper surface of the substrate.

14. The display device of claim 12, wherein
the second pixel electrode further comprises a second intermediate layer of the intermediate layer, and
a thickness of the second intermediate layer of the second pixel electrode which is non-overlapping the trench, is smaller than a thickness of the first intermediate layer of the first pixel electrode which corresponds to the trench.

15. A display device comprising:
a substrate comprising an upper surface;
a pixel circuit layer on the upper surface of the substrate and comprising a transistor;
an insulating layer on the pixel circuit layer, the insulating layer defining a trench; and
a pixel electrode layer on the insulating layer, the pixel electrode layer comprising:
a lower layer, an upper layer, and an intermediate layer between the lower layer and the upper layer;
each of the lower layer and the upper layer having a lower surface and an upper surface which is opposite to the lower surface;
a first pixel electrode overlapping the trench, the first pixel electrode comprising a first lower layer of the lower layer, a first upper layer of the upper layer, and a first intermediate layer of the intermediate layer;
a second pixel electrode comprising a second lower layer of the lower layer and a second upper layer of the upper layer;
a distance between the lower surface of the first lower layer of the first pixel electrode and the upper surface of the substrate is smaller than a distance between the lower surface of the second lower layer of the second pixel electrode and the upper surface of the substrate; and
a distance between the upper surface of the first upper layer of the first pixel electrode and the upper surface of the substrate is equal to a distance between the upper surface of the second upper layer of the second pixel electrode and the upper surface of the substrate.

16. The display device of claim 15, wherein the intermediate layer comprises at least one of zinc oxide, zinc tin oxide, indium zinc oxide and molybdenum oxide.

17. The display device of claim 15, wherein within the pixel electrode layer:
the intermediate layer comprises a first transparent conductive material, and
the upper layer comprises a second transparent conductive material different from the first transparent conductive material.

18. The display device of claim 15, wherein within the first pixel electrode, the first intermediate layer fills the trench in the insulating layer.

19. The display device of claim 15, wherein within the first pixel electrode, each of the first lower layer and the first upper layer has a uniform thickness.

20. The display device of claim 15, wherein the first pixel electrode further comprises:
a center area overlapping the trench, and a peripheral area which is adjacent to the center area,
the first intermediate layer in the center area and in the peripheral area, and
a thickness of the first intermediate layer in the center area being greater than a thickness of the first intermediate layer in the peripheral area.

21. A method of providing a display device, the method comprising:
providing a trench in an insulating layer; and
providing a pixel electrode in the trench,
wherein the providing of the pixel electrode comprises:
providing a lower conductive layer with a uniform thickness, on the insulating layer and extended into the trench;

providing, on the lower conductive layer, an intermediate conductive layer comprising a first transparent conductive material filling the trench;

providing, on the intermediate conductive layer, an upper conductive layer comprising a second transparent conductive material; and removing respective portions of the lower conductive layer, the intermediate conductive layer and the upper conductive layer which are adjacent to the trench.

22. The method of claim 21, wherein the providing of the trench in the insulating layer comprises simultaneously providing a via hole adjacent to the trench.

23. The method of claim 22, wherein the simultaneously providing of the trench and the via hole comprises a halftone mask process.

24. The method of claim 21, wherein the intermediate conductive layer comprises at least one of zinc oxide, zinc tin oxide, indium zinc oxide and molybdenum oxide.

25. The method of claim 21, wherein the providing of the intermediate conductive layer comprises an inkjet process.

26. The method of claim 21, wherein the providing of the lower conductive layer and the upper conductive layer comprises a sputtering deposition process.

* * * * *